United States Patent [19]

Berggren et al.

[11] 4,291,114
[45] Sep. 22, 1981

[54] IMAGEABLE, COMPOSITE-DRY TRANSFER SHEET AND PROCESS OF USING SAME

[75] Inventors: William R. Berggren, Woodbury; Shelby J. Brownley, St. Paul, both of Minn.

[73] Assignee: Minnesota Mining and Manufacturing Co., St. Paul, Minn.

[21] Appl. No.: 158,951

[22] Filed: Jun. 19, 1980

Related U.S. Application Data

[63] Continuation-in-part of Ser. No. 67,322, Oct. 18, 1978, abandoned.

[51] Int. Cl.³ .............. G03C 11/12; G03C 1/78; G03C 1/68
[52] U.S. Cl. .............. 430/253; 204/159.23; 204/159.24; 430/271; 430/273; 430/280; 430/281; 204/159.18
[58] Field of Search .............. 430/253, 260, 271, 273, 430/280, 281, 322; 204/159.18, 159.23, 159.24

[56] References Cited

U.S. PATENT DOCUMENTS

| | | | |
|---|---|---|---|
| 3,353,955 | 11/1967 | Colgrove | 430/253 |
| 3,627,529 | 12/1971 | Frank et al. | 430/253 |
| 3,754,920 | 8/1973 | Kuchta | 430/273 |
| 3,770,438 | 11/1973 | Celeste | 430/253 |
| 3,891,441 | 6/1975 | Tsuji et al. | 430/253 |
| 4,041,202 | 8/1977 | Hepher et al. | 430/253 |
| 4,050,936 | 9/1977 | Takeda et al. | 430/280 |
| 4,081,282 | 3/1978 | Merrill et al. | 430/273 |
| 4,090,936 | 5/1978 | Barton | 430/280 |
| 4,161,405 | 7/1979 | Crivello | 430/280 |
| 4,175,964 | 11/1979 | Uchida et al. | 430/253 |

Primary Examiner—Jack P. Brammer
Attorney, Agent, or Firm—Cruzan Alexander; Donald M. Sell; James V. Lilly

[57] ABSTRACT

An imageable composite dry-transfer sheet that comprises (a) a cover sheet transmissive to actinic radiation that has at least one oleophilic surface, (b) a photopolymerizable layer on the oleophilic surface of the cover sheet that comprises a cationically polymerizable organic material, a cationic photopolymerization initiator, and, optionally, a thermoplastic hydrocarbon resin that is chemically inert to said organic material and said initiator and (c) a base sheet with an oleophobic surface on the photopolymerizable layer wherein, after imagewise exposure to activating radiation, the interfacial adhesion of the unexposed areas of the photopolymerizable layer is greater for the cover sheet than for the base sheet; the interfacial adhesion of the exposed areas of the photopolymerizable layer is greater for the base sheet than for the cover sheet; and wherein, after separation of the cover and base sheets, the unexposed areas of the photopolymerizable layer are rendered burnishable by subsequent exposure to activating radiation through the cover sheet.

31 Claims, 6 Drawing Figures

IMAGEABLE, COMPOSITE-DRY TRANSFER SHEET AND PROCESS OF USING SAME

CROSS REFERENCE TO RELATED APPLICATION

This is a continuation-in-part of copending application Ser. No. 67,322 filed Oct. 18, 1978, now abandoned.

TECHNICAL FIELD

The present invention relates to image production and transfer. More particularly it relates to imageable composite dry-transfer sheets and their method of use.

In the present invention, an image is produced by exposing the composite dry-transfer sheet to activating radiation, e.g., ultraviolet light, in an image-wise manner. The image is then transferred to a suitable surface by burnishing (i.e., the application of pressure to the backside of the transfer sheet in the image areas). To be transferable in this manner, the image must have a stronger affinity for the receptor surface than for the substrate surface after burnishing. Additionally, the image must possess sufficient cohesive strength (i.e., film character) so that it transfers completely from the substrate to the receptor after burnishing even though pressure may not have been applied evenly to all parts of the image.

Pressure transfer of images from a substrate to a receptor has been previously described. For example, U.S. Pat. No. 3,013,917 describes sheets that contain ink designs in the form of characters. A wax coating is provided on the characters so as to make them pressure-transferable (i.e., burnishable). These sheets have not proven totally satisfactory, however, as it is necessary to maintain a large inventory of them in order to have sufficient quantities of all characters on hand. Moreover, non-standard characters are difficult to obtain and typically substantial lead times are required in order to make them available.

Sheets that employ photopolymerizable layers for the formation of images that are then transferable by dry transfer techniques are also known. Thus, see British Pat. No. 1,521,766 and U.S. Pat. No. 4,041,204. The photopolymerizable layer of these sheets must be image-wise exposed to activating radiation. The images are then developed by washing away the unexposed areas of the photopolymerizable layer. The exposed areas may then be burnished. These sheets are inconvenient to use because they require special developing equipment and solutions in order to wash away the unexposed areas of the photopolymerizable layer.

Still other photopolymerizable, image forming sheets are described in U.S. Pat. No. 4,081,282. However, a pressure-sensitive adhesive layer must be applied to the formed images of these sheets before they can be burnished.

U.S. Pat. No. 3,754,920 describes a sheet wherein the photopolymerizable layer utilizes a free radically polymerizable ethylenically unsaturated monomer. The photopolymerizable layer is situated between a support and a cover layer. After these sheets are image-wise exposed to activating radiation, the support and cover layers are separated from the photopolymerizable layer. The unexposed portions of the photopolymerizable layer are said to be burnishable onto a receptor. However, the transfer of these unexposed portions cleanly and with high resolution is difficult to achieve.

The present invention overcomes these disadvantages. It provides an imageable composite sheet material which permits the formation and ready transfer of images to a variety of receptors in a completely dry process. Consequently, the present invention permits the formation and transfer of images with conventional techniques thereby permitting simple and economical utilization.

The present invention also permits the user to form the desired characters from a variety of original sources such as hand drawn masters, pre-printed masters, photographic positives, etc., and then transfer them to a receptor. This eliminates the need to maintain a large inventory of sheets bearing preformed characters. It also gives the user great flexibility in the design of the characters to be transferred. The present invention also utilizes a photopolymerizable material whose polymerization is not inhibited by oxygen. Consequently, unexposed image areas can readily be either partially or completely polymerized if desired. Still other advantages of the present invention will be described hereinafter.

The imageable, composite dry-transfer sheets of the present invention may be employed in a number of ways. For example, they may be used as Do-It-Yourself transfer letter sheets. Alternatively, they may be used to form and then apply decorative or informative decals to receptors that include glass and metal. Still further, they may be used to form burnishable images from artwork (e.g., pictures, drawings, etc.) that may subsequently be transferred to receptors.

Other methods of use are also possible. Thus, the sheets of the invention may be used to make silk screen stencils and dry printing plates. Still other uses are possible as will be clear as a result of this disclosure.

DISCLOSURE OF INVENTION

In accordance with the present invention there is provided an imageable composite dry-transfer sheet that comprises (a) a cover sheet that is transmissive to activating radiation and has at least one oleophilic surface, (b) a photopolymerizable layer on the oleophilic surface of said cover sheet that comprises a cationically polymerizable organic material, and from about 0.1 to 10 parts by weight per 100 parts by weight of said organic material of a cationic polymerization initiator, and optionally, from about 1 to 100 parts by weight per 100 parts by weight of said organic material of a thermoplastic hydrocarbon resin that has a ring and ball softening point of more than about 100° C. and is chemically inert to said organic material and said initiator, and (c) a base sheet that has an oleophobic surface in contact with said photopolymerizable layer;

wherein said photopolymerizable layer has a complex shear modulus of, at most, $1 \times 10^6$ dynes/cm$^2$; and wherein, after image-wise exposure to activating radiation, the interfacial adhesion of the unexposed areas of said layer is greater for said cover sheet than for said base sheet; the interfacial adhesion of the exposed areas of said layer is greater for said base sheet than for said cover sheet; and wherein, after separation of said cover and said base sheets, the unexposed areas of said layer are rendered burnishable by subsequent exposure to activating radiation through said cover sheet.

The present invention combines peel-apart development and burnish transferability (burnishability) in achieving the foregoing results. These properties are the result of different interfacial adhesions of the base and cover sheets for the photopolymerizable layer. Thus, the photopolymerizable layer adheres more strongly to the cover sheet than to the base sheet prior to exposure to activating radiation. However, after the photopolymerizable layer has been exposed to activating radiation through the cover sheet, the now photopolymerized layer adheres more strongly to the base sheet than to the cover sheet. Consequently, when the photopolymerizable layer is exposed to activating radiation in an image-wise manner through the cover sheet, and the cover and base sheets are peeled apart, the exposed areas adhere to the base sheet and the unexposed areas adhere to the cover sheet.

The photopolymerizable layer demonstrates the following additional properties after image-wise exposure of the sheets to activating radiation:

(a) The cohesive strength of the unexposed areas of the layer is greater than the strength of the adhesion of these areas to the base sheet.

(b) The cohesive strength of the unexposed areas is less than, or equal to, the adhesion of these areas to the cover sheet.

(c) The photopolymerizable layer has sufficient vertical cohesion and frangibility to fracture cleanly at the boundary between the exposed and unexposed areas.

After the sheets of the invention have been image-wise exposed and peeled apart, the unexposed areas are rendered burnishable by being exposed to activating radiation through the cover layer or sheet. The now-burnishable areas possess sufficient cohesive strength, as opposed to particulate character, so that they transfer completely to the desired receptor even though not all of the coating has been subjected to the same degree of burnishing pressure.

The areas to be transferred also possess a balanced adhesion/cohesion so that they transfer completely to the receptor.

The foregoing characteristics of the invention are the result of the complex shear modulus of the photopolymerizable layer. Thus, it has been found that if the complex shear modulus exceeds $1 \times 10^6$ dyne/cm$^2$, both the unexposed and exposed areas of the photopolymerizable layer adhere more strongly to the base sheet than to the cover sheet. Consequently, when the cover and base sheets are peeled apart, there is nothing transferred to the cover sheet.

The complex shear modulus may be measured according to the procedures described in "Viscoelastic Properties of Polymers," J. D. Ferry, 2d. Ed., John Wiley & Sons, N.Y. (1970) at pages 121–124.

BRIEF DESCRIPTION OF DRAWINGS

The present invention is described in more detail hereinafter with reference to the accompanying drawings wherein like reference characters refer to the same elements throughout the several views and wherein.

DETAILED DESCRIPTION

Figure 1:
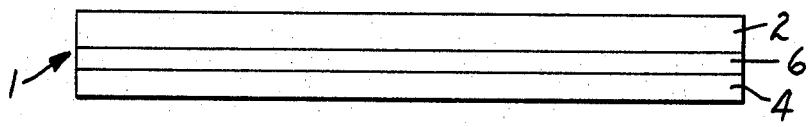
FIG. 1 shows an edge view of an imageable, composite dry-transfer sheet according to the invention.
Figure 2:
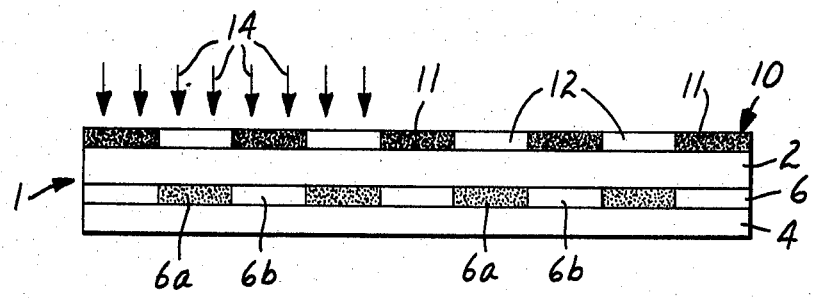
FIG. 2 shows an edge view of the sheet of FIG. 1 in contact with a graphic original being exposed through the original to activating radiation.
Figure 3:
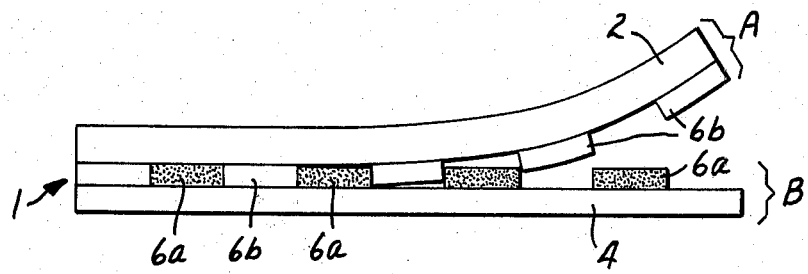
FIG. 3 shows the exposed sheet of FIG. 2 being peeled apart.
Figure 4:
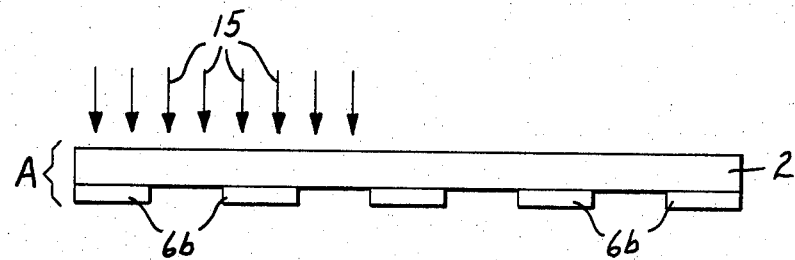
FIG. 4 shows the previously unexposed portions of the sheet of FIG. 3 being subjected to activating radiation.
Figure 5:
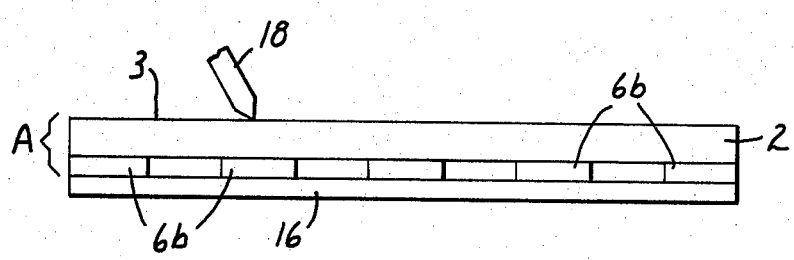
FIG. 5 shows the exposed sheet of FIG. 4 placed on a receptor and being burnished.
Figure 6:
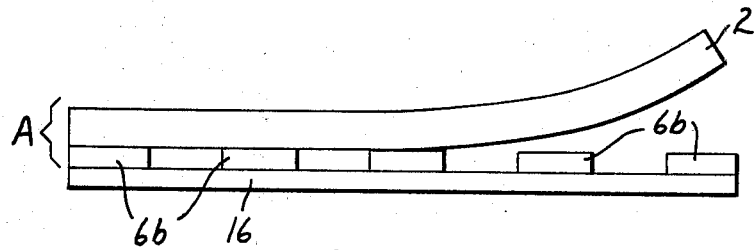
FIG. 6 shows the backing of the sheet of FIG. 4 being removed from the burnished images so that the images transfer to the receptor.

The cover sheet of the present invention must be transmissive to the activating radiation. While it may be oleophilic per se, it need have only one oleophilic surface for contact with the photopolymerizable layer. Thus, it may comprise a composite material that is made up of an oleophobic material that has been rendered oleophilic on at least one surface by coating or other surface treatment.

Examples of materials which are oleophilic per se, or which may be rendered oleophilic, and which are, therefore, useful as the cover sheet include certain polyester sheeting, cellulose acetate sheeting, polypropylene sheeting, polyethylene sheeting, vinyl chloride sheeting, etc.

The base sheet may be either transmissive or opaque to the activating radiation and must possess at least one oleophobic surface for contact with the photopolymerizable layer. Consequently, it may either be oleophobic per se or possess an oleophobic surface. Examples of materials useful as the base sheet include metal sheets and foils, polyester, cellulose acetate, etc.

Cationically polymerizable organic materials useful in the photopolymerizable layer include polymerizable epoxide-containing and vinyl ether-containing materials. These materials undergo cationically induced polymerization to yield higher molecular weight products. They may be of the monomeric or polymeric type and can be aliphatic, cycloaliphatic, aromatic or heterocyclic.

Useful epoxide-containing materials (hereinafter epoxides) are those having an average epoxide functionality of at least one. The epoxide functionality refers to an oxirane ring

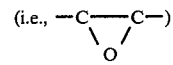

that is polymerizable by a cationically induced ring opening mechanism. Preferably the epoxides have an average epoxide functionality of at least two. The average epoxide functionality is determined by dividing the total number of epoxy groups in the epoxide by the total number of molecules of the epoxide.

Polymeric epoxides useful in the invention include linear polymers having terminal epoxy groups (e.g., diglycidyl ether of a polyoxyalkylene glycol), polymers having skeletal oxirane units (e.g., polybutadiene polyepoxide), and polymers having pendent epoxy groups (e.g., a glycidyl methacrylate polymer or copolymer). The epoxides may be pure compounds but are generally mixtures containing one, two, or more epoxy groups per molecule.

The epoxides may vary from low molecular weight monomeric materials to high molecular weight polymers and may vary greatly in the nature of their backbone and the substituent groups. For example, the backbone may be of any type and the substituent groups can be any group free of an active hydrogen atom which is reactive with an oxirane ring at room temperature. Illustrative of permissible substituent groups are halogens, ester groups, ether groups, sulfonate groups, siloxane groups, nitro groups, phosphate groups, etc. The molecular weight of the epoxides may vary from 58 to about 100,000 or more. Mixtures of various epoxides can be used in the compositions of this invention.

Examples of useful epoxides include those which contain cyclohexane oxide groups, such as the epoxycyclohexanecarboxylates typified by 3,4-epoxycyclohexylmethyl-3,4-epoxycyclohexanecarboxylate; 3,4-epoxy-2-methylcyclohexylmethyl-3,4-epoxy-2-methylcyclohexane carboxylate; and bis(3,4-epoxy-6-methylcyclohexylmethyl) adipate. For a more detailed list of useful epoxides of this nature, reference is made to the U.S. Pat. No. 3,117,099, incorporated herein by reference.

Other epoxides which are useful in the practice of this invention include glycidyl ether monomers of the formula

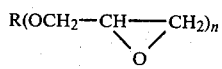

where R is alkyl or aryl and n is an integer of 1 to 6. Examples of these epoxides include the glycidyl ethers of polyhydric phenols obtained by reacting a polyhydric phenol with an excess of chlorohydrin such as epichlorohydrin (e.g., the diglycidyl ether of 2,2-bis-(2,3-epoxypropoxyphenol)propane). Further examples of epoxides of this type which can be used in the practice of this invention are described in U.S. Pat. No. 3,018,262, incorporated herein by reference, and in "Handbook of Epoxy Resins" by Lee and Neville, McGraw-Hill Book Company, New York (1967).

There are many commercially available epoxides which can be used in this invention. In particular, such epoxides include octadecylene oxide, epichlorohydrin, styrene oxide, vinyl cyclohexene dioxide, glycidol, glycidyl methacrylate, diglycidyl ether of Bisphenol A (e.g., those available under the trade designations "Epon 828", "Epon 1004" and "Epon 1010" from Shell Chemical Company, "DER-331", "DER-332", and "DER-334", from Dow Chemical Company), vinylcyclohexane dioxide (e.g., "ERL-4206" from Union Carbide Corporation), 3,4-epoxycyclohexylmethyl-3,4-epoxycyclohexane carboxylate (e.g., "ERL-4221" from Union Carbide Corporation), 3,4-epoxy-6-methylcyclohexylmethyl-3,4-epoxy-6-methylcyclohexane carboxylate (e.g., "ERL-4201" from Union Carbide Corporation), bis(3,4-epoxy-6-methylcyclohexylmethyl) adipate (e.g., "ERL-4299" from Union Carbide Corporation), bis(2,3-epoxycyclopentyl) ether (e.g., "ERL-0400" from Union Carbide Corporation), aliphatic epoxy modified with polypropylene glycol (e.g., "ERL-4050" and "ERL-4052" from Union Carbide Corporation), dipentene dioxide (e.g., "ERL-4269" from Union Carbide Corporation), epoxidized polybutadiene (e.g., "oxiron 2001" from FMC Corporation), silicone resin containing epoxy functionality, flame retardant epoxy resins (e.g., "DER-580", a brominated bisphenol type epoxy resin available from Dow Chemical Company), 1,4-butanediol diglycidyl ether of phenolformaldehyde novolak (e.g., "DEN-431" and "DEN-438" from Dow Chemical Company), and resorcinol diglycidyl ether (e.g., "Kopoxite" from Koppers Company, Incorporated).

Still other useful epoxides are copolymers of acrylic acid esters of glycidol such as glycidyl acrylate and glycidyl methacrylate with one or more copolymerizable vinyl compounds. Examples of such copolymers are 1:1 styrene:glycidyl methacrylate, 1:1 methyl methacrylate:glycidyl acrylate and a 62.5:24:13.5 methyl methacrylate:ethyl acrylate:glycidyl methacrylate terpolymer.

Other useful epoxides are well known and include epichlorohydrins, e.g., epichlorohydrin; alkene oxides, e.g., propylene oxide, styrene oxide; alkenyl oxides, e.g., butadiene dioxide; and glycidyl esters, e.g., ethyl glycidate.

Useful vinyl ether-containing materials (hereinafter vinyl ethers) are those containing at least one vinyl ether group (i.e., $CH_2=CHO-$). These materials are known and include the alkyl vinyl ethers represented by the formula $(H_2C=CHO)_mR^9$ wherein m is an integer of 1 to 4 and $R^9$ is an organic group (either polymeric or low molecular weight) that is free from groups that are reactive with the vinyl ether group. Representative of useful vinyl ethers is divinyl ether of diethylene glycol.

Combinations of two or more vinyl ethers are useful in the present invention as are combinations of epoxides with vinyl ethers.

Cationic photopolymerization initiators useful in polymerizing the epoxides and vinyl ethers include aromatic iodonium and sulfonium complex salts. Halogen-containing organic compounds are also useful as cationic polymerization initiators for the vinyl ethers. The initiators comprise from about 0.1 to 10 parts by weight per 100 parts by weight of the cationically polymerizable organic material. Preferably they comprise from about 0.5 to 7 parts by weight. The exact quantity of initiator employed is influenced by the polymerizable material and the initiator utilized, and the transmissivity of the polymerizable layer to activating radiation.

Useful aromatic iodonium and sulfonium complex salts have formulae selected from

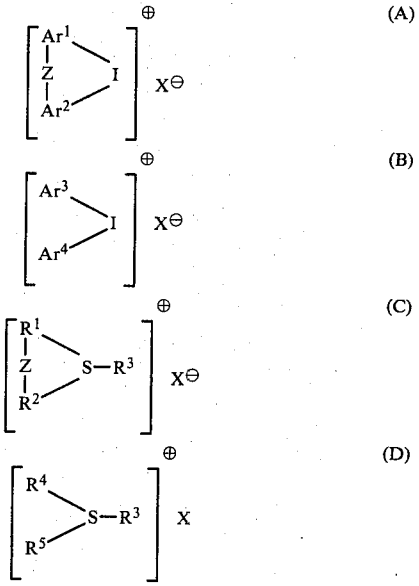

In these formulae, $Ar^1$ and $Ar^2$ are the same or different substituted and unsubstituted divalent aromatic groups that have from about 6 to 20 carbon atoms; $Ar^3$ and $Ar^4$ are the same or different substituted or unsubstituted monovalent aromatic groups that have from about 6 to 20 carbon atoms; $R^1$ and $R^2$ are selected from substituted and unsubstituted divalent aromatic groups that contain from about 6 to 20 carbon atoms and substituted or unsubstituted alkylene groups that contain from about 1 to about 20 carbon atoms; and $R^3$, $R^4$ and $R^5$ are each selected from substituted and unsubstituted monovalent aromatic groups that contain from about 6 to 20 carbon atoms and substituted and unsubstituted alkyl groups that contain from 1 to 20 carbon atoms, provided that at least one of the $R^1$ through $R^5$ groups is aromatic. Preferably, each of the $R^1$ through $R^5$ groups is aromatic.

In formulae A and C, Z is selected from a carbon-to-carbon bond; oxygen, sulfur, S=O, C=O, O=S=O, $R^6$—N wherein $R^6$ is aryl or acyl, $R^7$—C—$R^8$ wherein $R^7$ and $R^8$ are selected from hydrogen, alkyl groups that contain from about 1 to 4 carbon atoms, and alkenyl groups that contain from about 2 to 4 carbon atoms.

In all formulae X is a halogen-containing complex anion.

Representative examples of useful $Ar^1$, $Ar^2$ and aromatic $R^1$ and $R^2$ groups include phenylene, thienylene, furanylene, and pyrazolylene groups.

Representative examples of useful $Ar^3$, $Ar^4$ and aromatic $R^3$, $R^4$ and $R^5$ groups include phenyl, thienyl, furanyl, and pyrazol groups.

The divalent and monovalent groups may also have one or more fused benzo rings (e.g., naphthyl, naphthylene and the like; benzothienyl, benzothienylene, benzofuranyl, benzofuranylene, dibenzofuranyl; etc.). The divalent and monovalent aromatic groups may also be substituted, if desired, by one or more of the following groups: halogen, nitro, hydroxyl, ester groups (e.g., alkoxycarboxyl such as methoxycarbonyl and ethoxycarbonyl, phenoxycarbonyl and acyloxy such as acetoxy and propionyloxy), sulfo ester groups (e.g., alkoxysulfonyl such as methoxysulfonyl and butoxysulfonyl, phenoxysulfonyl, and the like), alkoxy groups (e.g., methoxy, ethoxy, butoxy, and the like), aryl groups (e.g., phenyl), alkyl groups (e.g., phenoxy), thioaryloxy groups (e.g., thiophenoxy), alkylsulfonyl (e.g., methylsulfonyl, ethylsulfonyl, and the like), arylsulfonyl groups (e.g., phenylsulfonyl groups), perfluoroalkyl groups (e.g., trifluoromethyl, perfluoroethyl, and the like), and perfluoroalkylsulfonyl groups (e.g., trifluoromethylsulfonyl, perfluorobutylsulfonyl, and the like).

Halogen-containing anions (X) useful in the invention include tetrafluoroborate, hexafluoroarsenate, hexafluorophosphate and hexafluoroantimonate.

The aromatic iodonium cations are known and recognized in the art. See for example U.S. Pat. Nos. 3,565,906; 3,712,920; 3,759,989; and 3,763,187; F. Beringer, et al., Diaryliodonium Salts IX, J. Am. Chem. Soc. 81, 342-51 (1959) and F. Beringer, et al., Diaryliodonium Salts XXIII, J. Chem. Soc. 1964, 442-51; F. Beringer, et al., Iodonium Salts Containing Heterocyclic Iodine, J. Org. Chem. 30 1141-8 (1965).

Representative examples of useful aromatic iodonium complex salts include
  diphenyliodonium tetrafluoroborate
  di(4-methylphenyl)iodonium tetrafluoroborate
  phenyl-4-methylphenyliodonium tetrafluoroborate
  di(4-heptylphenyl)iodonium tetrafluoroborate
  di(3-nitrophenyl)iodonium hexafluorophosphate
  di(4-chlorophenyl)iodonium hexafluorophosphate
  di(naphthyl)iodonium tetrafluoroborate
  di(4-trifluoromethylphenyl)iodonium tetrafluoroborate
  diphenyliodonium hexafluorophosphate
  di(4-methylphenyl)iodonium hexafluorophosphate
  diphenyliodonium hexafluoroarsenate
  di(4-phenoxyphenyl)iodonium tetrafluoroborate
  phenyl-2-thienyliodonium hexafluorophosphate
  3,5-dimethylpyrazolyl-4-phenyliodonium hexafluorophosphate
  bis-(2,4-dimethylphenyl)iodonium hexafluoroantimonate
  diphenyliodonium hexafluoroantimonate
  2',2-diphenyliodonium tetrafluoroborate
  di(2,4-dichlorophenyl)iodonium hexafluorophosphate
  di(4-bromophenyl)iodonium hexafluorophosphate
  di(4-methoxyphenyl)iodonium hexafluorophosphate
  di(3-methoxycarbonylphenyl)iodonium hexafluorophosphate
  di(3-methoxysulfonylphenyl)iodonium hexafluorophosphate
  di(2-benzothienyl)iodonium hexafluorophosphate The aromatic iodonium complex salts preferred in the present invention are the diaryliodonium hexafluorophosphate and the diaryliodonium hexafluoroantimonate salts.

The aromatic iodonium complex salts may be prepared by metathesis of corresponding aromatic iodonium simple salts (such as, for example, the diphenyliodonium bisulfate) in accordance with the teachings of Beringer et al., J. Am. Chem. Soc. 81, 342 (1959). Alternatively, they may be prepared in accordance with Beringer et al., above, by various methods including (1) coupling of two aromatic compounds with iodyl sulfate in sulfuric acid, (2) coupling of two aromatic compounds with an iodate in acetic acid-acetic anhydride-sulfuric acid, (3) coupling of two aromatic compounds with an iodine acylate in the presence of an acid, and (4) condensation of an iodoso compound, an iodoso diacetate, or an iodoxy compound with another aromatic compound in the presence of an acid.

More specifically, aromatic iodonium complex salts may be prepared by reacting an appropriate aromatic iodine salt (e.g., 316.5 g $\phi_2 I^+ Cl^-$) with a desired complex salt (e.g., 252.8 g $AgPF_6$) in a polar solvent such as methyl alcohol. Reaction may be conveniently carried out at room temperature.

Aromatic sulfonium salts are known and recognized in the art. Triaryl-substituted sulfonium compounds, for example, can be prepared by the procedures described in G. H. Wiegand, et al., Synthesis and Reactions of Triaryl-sulfonium Halides, J. Org. Chem. 33, 2671-75 (1968). Aromatic sulfonium salts also having alkyl-substitution can be prepared by the procedures described in K. Ohkubo et al., J. Org. Chem. 36, 3149-55 (1971). Yet another method for making triaryl-substituted sulfonium compounds is described in U.S. Pat. No. 2,807,648, incorporated herein by reference, from which the complex sulfonium salts can be made. The complex sulfonium salts can be prepared from the corresponding simple salts, such as the halide salts, by metathesis with a metal or ammonium salt of the complex anion desired.

Examples of useful aromatic sulfonium complex salt photoinitiators include:
  triphenylsulfonium tetrafluoroborate
  methyldiphenylsulfonium tetrafluoroborate
  dimethylphenylsulfonium hexafluorophosphate
  triphenylsulfonium hexafluorophosphate
  triphenylsulfonium hexafluoroantimonate
  triphenylsulfonium hexafluoroarsenate diphenylnaphthylsulfonium hexafluoroarsenate
triphenylsulfonium hexafluoroarsenate
tritolysulfonium hexafluorophosphate
anisyldiphenylsulfonium hexafluoroantimonate
4-butoxyphenyldiphenylsulfonium tetrafluoroborate
4-chlorophenyldiphenylsulfonium hexafluoroantimonate
4-chlorophenyldiphenylsulfonium hexafluoroarsenate
tris(4-phenoxyphenyl)sulfonium hexafluorophosphate di(4-ethoxyphenyl)methylsulfonium hexafluoroarsenate
4-acetoxy-phenyldiphenylsulfonium tetrafluoroborate
tris(4-thiomethoxyphenyl)sulfonium hexafluorophosphate
di(methoxysulfonylphenyl)methylsulfonium hexafluoroantimonate
di(methoxynaphthyl)methylsulfonium tetrafluoroborate
4-phenylthiophenyldiphenylsulfonium hexafluoroantimonate
4-phenylthiophenyldiphenylsulfonium hexafluoroarsenate
di(carbomethoxyphenyl)methylsulfonium hexafluorophosphate
dimethylnaphthylsulfonium hexafluorophosphate
trifluoromethyldiphenylsulfonium tetrafluoroborate
methyl(N-methylphenothiazinyl)sulfonium hexafluoroantimonate
phenylmethylbenzylsulfonium hexafluorophosphate

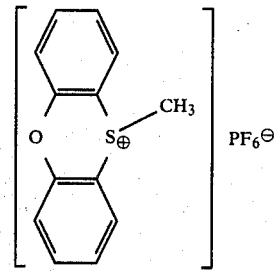

(10-methylphenoxathiinium hexafluorophosphate)

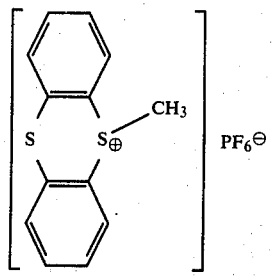

(5-methylthianthrenium hexafluorophosphate)

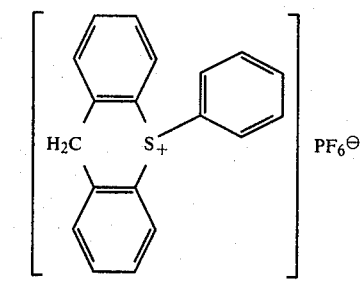

(10-phenylthioxanthenium hexafluorophosphate)

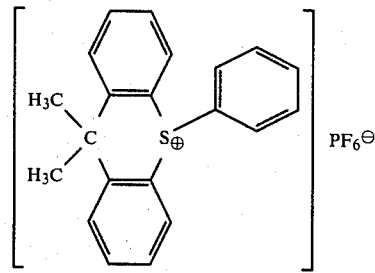

(10-phenyl-9,9-dimethylthioxanthenium hexafluorophosphate)

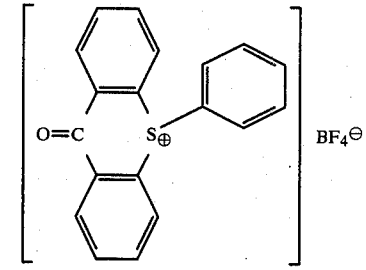

(10-phenyl-9-oxothioxanthenium tetrafluoroborate)

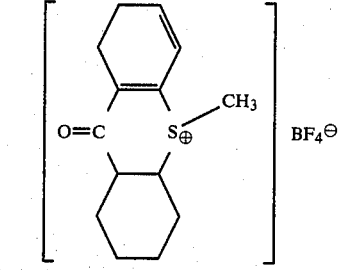

(5-methyl-10-oxothianthrenium tetrafluoroborate)

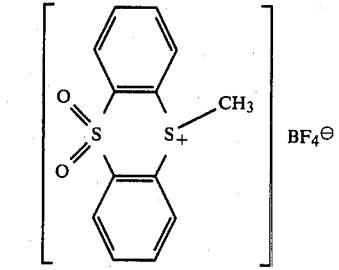

(5-methyl-10,10-dioxothianthrenium hexafluorophosphate)

Halogen-containing compounds useful as initiators in the present invention contain halogen attached to carbon. These compounds, upon exposure to radiation of suitable wavelength (i.e., 300–900 nanometers), dissociate and form halogen acids. The bond dissociation energy for the carbon-to-halogen bonds is in the range of about 40 to 70 kilogram calories per mole. They are, preferably, solid organic compounds which are neither strongly acidic nor strongly basic.

Examples of useful halogen-containing compounds include 1-methyl-3,5-bistrichloromethyl triazine, 1,3,5-tristrichloromethyl triazine, 1,3,5-tristribromoethyl triazine, hexabromoethane, carbon tetrabromide, α, α, dibromo-o-xylene.

Thermoplastic hydrocarbon resins useful in the present invention comprise from about 1 to 100 parts by weight per 100 parts by weight of the cationically polymerizable material. Preferably they comprise from about 10 to 40 parts, and most preferably about 20 parts, per 100 parts of the polymerizable material. These resins impart cohesive strength to the unexposed areas of the photopolymerizable layer.

Suitable thermoplastic resins have a ball and ring softening point of at least 100° C. and are chemically inert to the cationically polymerizable organic material and the photopolymerization initiator in the absence of activating radiation. Additionally, they do not increase the cohesive nature of the unpolymerized photopolymerizable layer beyond the limits described above and do not alter the adhesion balance of the exposed and unexposed areas of the photopolymerizable layer to the base and cover sheets beyond the limits previously described.

Representative examples of useful thermoplastic resins include block copolymers, polyolefin resins, and acrylic resins. Representative examples of useful block copolymers are Kraton 1101, a block copolymer having terminal blocks of styrene and central blocks of butadiene groups, and Kraton 1650 having terminal blocks of styrene groups and central blocks of combinations of ethylene and butylene groups. The Kraton resins are available from Shell Chemical Company.

Representative examples of useful polyolefin resins include polystyrene resins such as Piccolastic ® C125, a modified, low molecular weight resin produced largely from styrene monomer and having a ring and ball softening point in the range of 122°-128° C., available from Hercules Incorporated; and Styron ® 685, a polystyrene resin available from Dow Chemical Company.

Representative examples of useful acrylic resins include Elvacite ® 2041 (a methyl methacrylate polymer, glass transition temperature of 95° C.), available from DuPont.

Various other ingredients may be included in the photopolymerizable layer of the present invention. For example, tackifying agents, plasticizing agents, sensitizers, colorants, fillers, viscosity modifiers, and so forth, may be included.

Tackifying agents typically comprise up to 200 parts by weight per 100 parts by weight of the organic cationically polymerizable material. Useful tackifying agents have a ring and ball softening point below about 100° C. and preferably below about 60° C. and include rosin and rosin derivatives, low molecular weight styrene resins, cyclohexanone resins, coumarone resins, indene resins, terpene resins, coumarone-indene resin, etc. Specific examples of useful tackifying resins include polystyrene such as Piccolastic ® A series of resins having ring and ball softening points below about 100° C. such as A-25 (ring and ball softening point in the range of 24°-27° C. available from Hercules Chemical Company) and polymerized mixed olefins such as the Sta-Tac and Super Sta-Tac series of resins from Reichold Chemical Company. Other specific examples include Foral 85, a hydrogenated ester resins available from Hercules Incorporated.

Representative examples of useful plasticizing agents are solid phthalate esters, e.g., dicyclohexylphthalate, and para-toluene-sulfonamide and its derivatives, etc. Other materials that may be employed as plasticizing agents include heavy mineral oils such as Drakeol 35 a white mineral oil available from Pennsylvania Refining Company; Shellmax 500, a microcrystalline wax available from Shell Chemical Company and Elvax ® 150, an ethylene/vinyl acetate copolymer available from DuPont.

The use of tackifying resins and plasticizing agents in the present invention is particularly preferred. Thus, without at least one of these materials present in the photopolymerizable layer, the unphotopolymerized areas to be transferred can be only partially polymerized before burnishing. However, when either or both of these materials are present in the unphotopolymerized areas to be transferred, they can be completely polymerized before burnishing. These ingredients are apparently unaffected by exposure to the activating radiation. In any event, the images transferred are resistant to abrasion and smearing.

The photopolymerization initiators useful in the present invention are of themselves photosensitive only in the ultraviolet. They, however, can be sensitized to the near ultraviolet and the visable range of the spectrum by a variety of sensitizers. Typically, the sensitizers comprise up to about 10 parts by weight per 100 parts by weight of cationically polymerizable material.

Examples of useful sensitizers may be found in the following categories:

(1) Aromatic tertiary amines having the formula

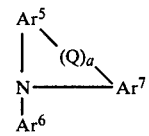

where $Ar^5$, $Ar^6$ and $Ar^7$ are aromatic groups having 6 to 20 carbon atoms and may be the same or different. The aromatic groups may be substituted, if desired, with groups or radicals such as hydroxyl, alkoxy, acyl or alkyl. Q may be oxygen; sulfur; S=O; C=O; O=S=O; $R^9$—N where $R^9$ is aryl (of 6 to 20 carbons, such as phenyl, naphthyl, etc.); a carbon-to-carbon bond; or $R^7$—C—$R^8$, where $R^7$ and $R^8$ are selected from hydrogen, alkyl radicals of 1 to 4 carbons, and alkenyl radicals of 2 to 4 carbons, and wherein a is zero or 1.

(2) Aromatic tertiary diamines having the formula

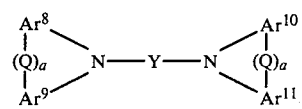

where Y is a divalent radical selected from arylene and $Ar^{12}$-Z-$Ar^{13}$, where Q is as described above for aromatic tertiary amines; $Ar^8$, through $Ar^{13}$ are aromatic groups having 6 to 20 carbon atoms and may be the same or different; and each a is, individually, zero or 1. The aromatic groups may be substituted, if desired, with groups or radicals such as hydroxyl, alkoxy, acyl or alkyl.

(3) Aromatic polycyclic compounds having at least three fused benzene rings and having an ionization energy less than about 7.5 ev., as calculated by the method of F. A. Matsen, *J. Chem. Physics,* 24, 602 (1956), incorporated herein by reference.

Other useful classes of sensitizers are xanthenes, thiazoles, polymethines, methines, acridines, diphenylmethanes, thiazines, azines, aminoketones, porphyrins, aromatic polycyclic hydrocarbons, p-substituted aminostyryls, aminotriaryl methanes, non-basic propenone compounds described in U.S. Pat. No. 3,617,288.

Representative examples of sensitizers coming within the above useful classes include:
triphenylamine
dinaphthylphenylamine
N,N-diphenyl-N-p-methoxyphenylamine
9-(N,N-diphenylamino)-anthracene
N,N,N',N'-tetraphenyl-p-phenylenediamine
N,N,N',N'-tetraphenylbenzidine
N-phenylphenothiazine
N-phenylphenoxazine N,N'-diphenyldibenzopiperazine
N-phenyl-9,10-dihydroacridine
N-naphthylacridine
4,4'-diphenylaminodiphenylether
anthracene
2-ethyl-9,10-dimethoxyanthracene
9,10-diethoxyanthracene
1,2-benzanthracene
perylene
rubrene
tetraphenylpyrene
9,10-diphenylanthracene
tetracene
pentacene
anthanthrene
Rhodamine 6G (C.I. 45160)
Acridine Orange (C.I. 52015)
Hematoporphyrin
Protoporphyrin
Benzoflavin The above classes of sensitizers, together with additional examples of each, may be found in U.S. Pat. No. 3,515,552; 3,617,288; 3,640,718; 3,729,313 and 4,069,054.

Colorants, fillers, viscosity modifiers, extenders, and so forth may also be incorporated into the photopolymerizable layer. Typically these ingredients comprise up to about 75 parts by weight per 100 parts by weight of the cationically polymerizable material.

Useful colorants include pigments such as carbon black (e.g., Raven 22 available from Cities Service) and dyes. They may be opaque and may be conductive or resistive materials. Such materials may include fine metal powders.

Useful fillers and viscosity modifiers include talc, clay, aluminum oxide, silica (e.g., Cab-O-Sil U-5 from Cabot Corporation), etc.

Useful extenders include organic resins such as segmented polyester resins prepared as described in U.S. Pat. No. 4,049,483, and hydroxy terminated polyester resins such as Multron R-18 available from Mobay Chemical Company. Still other useful polyesters include the aliphatic polyesters of sebacic acid and 1,4-cyclohexane dimethanol.

The formation and transfer of images according to the present invention is achieved in a surprisingly simple manner. Thus, referring to the drawings, FIG. 1 illustrates an imageable, composite dry-transfer sheet 1 comprising a cover sheet 2 that has an oleophilic surface, a base sheet 4 that has an oleophobic surface, and a photopolymerizable layer 6 interposed between the oleophilic surface of cover sheet 2 and the oleophobic surface of base sheet 4.

In use, as illustrated in FIGS. 2-6, images are formed in sheet 1 by placing an original 10 in contact with cover sheet 2. Preferably original 10 is in intimate contact with cover sheet 2. Original 10 has areas 11 which are non-transmissive to activating radiation 14 and areas 12 that are transmissive to activating radiation 14.

Sheet 1 is exposed to activating radiation 14 (See FIG. 2) through original 10 for a time and at an intensity sufficient to cause the formation of polymerized areas 6a in photopolymerizable layer 6. Areas 6a correspond directly to the transmissive areas 12 of original 10.

Areas 6b in photopolymerizable layer 6 are not exposed to radiation 14 and therefore do not polymerize. Areas 6b correspond directly to non-transmissive areas 11 of original 10.

The photopolymerizable layer is generally exposed to ultraviolet light for a short period of time, e.g., three minutes, to bring about image-wise polymerization of the exposed areas of layer 6. The resultant areas 6a and 6b represent a negative and a positive, respectively, of the image on original 10.

After exposure to radiation 14, sheet 1 is peeled apart (see FIG. 3) to provide component A bearing unpolymerized areas 6b and component B bearing polymerized areas 6a.

Component A is then exposed to activating radiation 15 through cover sheet 2 for a time and at an intensity to at least partially polymerize areas 6b. See FIG. 4. After exposure, component A is placed in contact with a receptor 16 such that the at least partially exposed areas 6b contact the receptor. See FIG. 5.

Pressure is then applied to the backside 3 of component A, for example by a burnishing tool 18, over the areas 6b to be transferred. After burnishing, component A is peeled off of receptor 16. See FIG. 6. In so doing, areas 6b release from cover sheet 2 of component A and adhere to receptor 16. The transferred image areas are non-tacky and resistant to smearing and abrasion.

Typically the exposure of component A is to ultraviolet light and requires only about 30 seconds to achieve transferability for partially polymerized areas 6b. Slightly longer times (e.g., 3 minutes or more) are normally required to effect complete polymerization of areas 6b.

Component B cannot be burnished but can serve as an original to make a negative image that is burnishable. Thus, the negative image produced with another sheet of the invention thereon may be transferred to a receptor in a similar manner as employed to transfer a positive image. Component B may also be used as a sign or label.

Although the activating radiation has been described only with reference to ultraviolet light, the photopolymerizable layer will also polymerize upon exposure to a source of radiation of other wavelengths, e.g., visible light. Suitable sources of radiation include mercury, xenon, carbon arc, tungsten filament lamps, sunlight, etc. Exposures may be from less than 30 seconds to more than 15 minutes depending upon the amounts of particular polymerizable materials and complex salts being utilized, the absence or presence of sensitizers, the radiation source and distance from the source, the transmissivity of the photopolymerizable layer to the activating radiation, and the thickness of the photopolymerizable layer to be polymerized. The compositions may also be polymerized by exposure to electron beam irradiation. Generally speaking the dosage necessary is from less than 1 megarad to 100 megarad or more.

The imageable sheets of the invention may be readily prepared using conventional processing techniques. Thus the photopolymerizable composition is first prepared by combining the cationically polymerizable material and any colorants to be employed. The remaining components of the photopolymerizable layer are mixed together and then combined with the cationically polymerizable material and the colorant. Conventional mixing techniques are utilized. The combination of ingredients is mixed until uniform and then applied to the nonpolar surface of the oleophilic cover sheet by, for example, knife, reverse roll, or Meyer bar coating.

The coated cover sheet is then typically dried at less than 70° C. for one half to five minutes. The resulting photopolymerizable layer is typically 2.5 to 25 micrometers thick. The base sheet is then laminated to the photopolymerizable layer by, for example, conventional techniques so that an oleophobic surface contacts the photopolymerizable layer. The preparation of the imageable sheet is carried out in the absence of activating radiation.

The present invention is further illustrated with reference to the following examples wherein the term parts refers to parts by weight unless otherwise noted.

EXAMPLE 1

Imageable composite dry-transfer sheets according to the invention were prepared. The cover sheet comprised a section of biaxially oriented poly(ethylene terephthalate) (PET) film which had an oleophilic coating of a silicone surface-active agent on one surface. This film was obtained from Akrosil Corporation as type 2C-5459. It was 35 micrometers thick.

The cationically polymerizable photopolymerizable layer was applied from a composition that contained the following ingredients:

| Ingredient | Parts |
| --- | --- |
| 3,4-epoxycyclohexylmethyl-3,4-epoxycyclohexane carboxylate (Bakelite ERL-4221 from Union Carbide Corporation) | 15.4 |
| Carbon black (Raven 22, a furnace carbon black from the Columbian Division of Cities Service Company) | 4.3 |
| Triarylsulfonium hexafluoroantimonate (10% by weight solution in methyl ethyl ketone) (TASHFA)* | 7.7 |
| 2-ethyl-9,10-dimethoxyanthracene (5% by weight solution in methyl ethyl ketone) (EDMA) | 7.7 |
| Pyrogenic silica (Cab-O-Sil M-5 from Cabot Corporation) | 1.2 |
| Segmented polyester resin (25% by weight in methyl ethyl ketone) prepared according to Example 1 of U.S. Pat. No. 4,049,483, col. 6, lines 53-68 | 19.7 |
| Thermoplastic rubber (25% by weight in toluene. A block copolymer available as Kraton 1101 from Shell Chemical Company) | 9.9 |
| Methyl ethyl ketone (MEK) | 34.1 |

*50% by weight 4-Phenylthiophenyldiphenylsulfonium hexafluoroantimonate
45% by weight triphenylsulfonium hexafluoroantimonate
5% by weight 4-chlorophenyldiphenylsulfonium hexafluoroantimonate The composition was coated onto the oleophilic surface of the PET with a No. 22 Meyer bar and then dried at 65° C. for 2 minutes in an air circulating oven. An oleophobic base sheet of PET film was then laminated to the dried photopolymerizable layer.

The resultant imageable, composite dry-transfer sheet was image-wise exposed to ultraviolet (UV) light in a model EU 8000 Ultraviolet Exposure unit from 3 M. Exposure was achieved by placing a stencil on the cover sheet and exposing the transfer sheet through the stencil to ultraviolet light from General Electric fluorescent lamps (model number F15T8-BL) for three minutes. Intimate contact was maintained between the stencil and the transfer sheet by placing a glass plate over the stencil and pressing the stencil/sheet combination onto a sponge with the oleophobic base sheet of the transfer sheet in contact with the sponge.

After exposure, the cover sheet was stripped away from the base sheet. The cover sheet and an unpolymerized positive image on it while the base sheet had a polymerized negative image on it. The positive and negative images separated cleanly from each other.

The cover sheet (with positive image) was placed in the exposure unit with the imaged side in contact with a sheet of plain bond paper which had been folded in an accordion-like fashion so that the image areas had minimal contact therewith. The image areas were then exposed through the cover sheet to ultraviolet light for 30 seconds. The cover sheet (with the partially cured positive image) was then placed upon a receptor (a sheet of bond paper) so that the partially cured images were in contact with the receptor. The images were then transferred to the paper receptor by applying pressure to the back of the cover sheet with a burnishing tool. When the cover sheet was separated from the bond paper, the burnished image was completely transferred to and adhered on the paper. The surface of the image was non-tacky and resistant to smearing and abrasion.

Sheets prepared according to this example were also found useful in transferring images to other receptors such as cardboard, acetate film, poly(ethylene terephthalate) film and metal foil.

EXAMPLE 2

Example 1 was repeated except that the photopolymerizable layer was applied to the cover sheet from the following composition:

| Ingredient | Parts |
| --- | --- |
| ERL-4221 (Union Carbide Corporation) | 17.2 |
| Raven-22 (Cities Service Company) | 4.8 |
| TASHFA (10% by weight in MEK) | 8.5 |
| EDMA (5% by weight in MEK) | 8.5 |
| Cab-O-Sil M-5 (Cabot Corporation) | 1.3 |
| Acrylic resin (Elvacite 2041 from E. I. DuPont 25% by weight in MEK) | 10.9 |
| Hydroxy terminated polyester (Multron R-18 from Mobay Chemical Company) | 10.9 |
| MEK | 37.9 |

The dry transfer sheet was imaged as described in Example 1 and the base sheet and the cover sheet stripped away from each other. Separate portions of the cover sheet, bearing an unpolymerized positive image, were post exposed for various lengths of time as described in Example 1 to partially cure the image. The positive images were then transferred to a piece of bond paper by burnishing as described in Example 1. The results of the tests are set forth below in Table 1.

TABLE 1

| Post Exposure (Min) | Comments |
|---|---|
| 3 | Complete transfer. Images non-tacky and resistant to abrasion and smearing. |
| 6 | Complete transfer. Images non-tacky and resistant to abrasion and smearing. |
| 9 | Complete transfer. Images non-tacky and resistant to abrasion and smearing. |
| 12 | Some loss in burnishability in that additional pressure needed to burnish. Images less resistant to abrasion. |
| 15 | Some loss in burnishability in that more pressure needed than required in 12 min. exposure sample. Images less resistant to abrasion. |

EXAMPLES 3–11

A series of imageable composite dry-transfer sheets according to the invention were prepared according to the procedures described in Example 1 except that the photopolymerizable layer of each was different. In each example the cover sheet comprised a section of biaxially oriented PET that had been coated with a silicone surface-active agent to render one surface oleophilic. The silicone-treated cover sheet was UBL 110-1 available from Akrosil Corporation. The oleophobic base sheet in each example was a biaxially oriented PET film.

Each sheet was imaged and used in a burnishing process as described in Example 1 except that the positive image, which was transferred by burnishing, was burnishable even though it was completely polymerized by the post exposure. Post exposures of up to 15 minutes were used. In all cases the transferred images were non-tacky and resistant to abrasion and smearing.

The components used in the photopolymerizable compositions are set forth below in Table 2.

TABLE 2

| COMPOSITION | 3 | 4 | 5 | 6 | 7 | 8 | 9 | 10 | 11 |
|---|---|---|---|---|---|---|---|---|---|
| ERL-4221 | 22.8 | 19.3 | | | | | | | |
| ERL-4299[1] | | | 24 | 24 | 24 | 24 | 25.7 | | |
| Divinylether of diethylene glycol[2] | | | | | | | | 24 | 24 |
| Raven 22 | 6.4 | 5.4 | 6.8 | 6.8 | 6.8 | 6.8 | | 6.8 | 6.8 |
| TASHFA | 1.5 | 1.2 | 1.5 | | | | 1.7 | 1.5 | |
| diphenyliodonium hexafluorophosphate | | | | 1.5 | | | | | |
| Bis-(2,4-dimethylphenyl) iodonium hexafluoroantimonate | | | | | 1.5 | | | | |
| Triarylsulfonium hexafluoroarsenate[3] | | | | | | 1.5 | | | |
| 1-methyl-3,5-bistrichloromethyl triazine | | | | | | | | | 1.5 |
| EDMA | 1.5 | 1.2 | 1.5 | 1.5 | 1.5 | 1.5 | 1.7 | 1.5 | 1.5 |
| Aliphatic polyester of sebacic acid and 1,4-cyclohexane dimethanol (50% by weight in toluene) | 18.3 | | | | | | | | |
| Foral 85 (75% by weight in MEK)[4] | 10 | 16.1 | 15.4 | 15.4 | 15.4 | 15.4 | 16.5 | 15.4 | 15.4 |
| Elvacite 2044 (25% by weight in MEK)[5] | 14.6 | 12.4 | 15.4 | 15.4 | 15.4 | 15.4 | 16.5 | 15.4 | 15.4 |
| Kraton 1101 (25% by weight in MEK) | 22 | | | | | | | | |
| Kraton 1650 (20% by weight in 50/50 toluene/heptane)[6] | | 18.6 | 23.1 | 23.1 | 23.1 | 23.1 | 24.7 | 23.1 | 23.1 |
| Drakeol 35[7] | | 1 | | | | | | | |
| Shell max 500 (25% by weight in toluene)[8] | | 12.4 | 12.3 | 12.3 | 12.3 | 12.3 | 13.2 | 12.3 | 12.3 |
| Elvax 150 (25% by weight in MEK)[9] | | 12.4 | | | | | | | |
| Ethanol | 2.9 | | | | | | | | |

[1] bis(3,4-epoxy-6-methylcyclohexylmethyl)adipate available from Union Carbide Corporation.
[2] Available from GAF.
[3] 50% by weight 4-phenylthiophenyldiphenylsulfonium hexafluoroarsenate. 45% by weight triphenylsulfonium hexafluoroarsenate. 5% by weight 4-chlorophenyldiphenylsulfonium hexafluoroarsenate.
[4] A hydrogenated ester resin from Hercules, Inc.
[5] An n-butyl methacrylate polymer from DuPont.
[6] A thermoplastic rubber/styrene block copolymer, available from Shell Chemical Co.
[7] A white mineral oil available from Pennsylvania Refining Co.
[8] A microcrystalline wax available from Shell Chemical Co.
[9] An ethylene/vinyl acetate copolymer available from E. I. du Pont de Nemours.

EXAMPLE 12

Imageable composite dry-transfer sheets according to the invention were prepared. The cover sheet comprised a section of biaxially oriented PET film which had been coated with a silicone surface-active agent to render its surface oleophilic. The film was UBL 110-1 available from Akrosil Corporation. A sheet of PET film was employed as the oleophobic base sheet.

The cationically polymerizable layer was applied from a composition that contained the following ingredients:

| Ingredient | Part |
|---|---|
| ERL 4299 | 19.5 |
| Raven 22 | 5.5 |
| Elvacite 2044 (25% in MEK) | 12.4 |
| TASHFA | 1.2 |
| 9,10-Diethoxyanthracene (DEA) | 1.2 |

-continued

| Ingredient | Part |
|---|---|
| Kraton 1650 | 3.7 |
| Shellmax 500 | 2.5 |
| Piccolastic A-25 (polystyrene resin from Hercules Chemical Co.) | 6.8 |
| Toluene/Heptane (1:1) | 19.6 |
| MEK | 27.6 |

The Kraton 1650, Shellmax 500 and Piccolastic A-25 were mixed together under high shear using a laboratory Dispersator with a Hi-Vis ® head. Mixing was carried out at a temperature of about 150° C. for 30 min. The mixture was then cooled below room temperature with dry ice, ground into small chunks and solubilized with a 1:1 by weight blend of toluene:heptane to a final solids content of 40%. The remaining ingredients were then added to the solution and the entire formulation was run through a Manton Gaulin laboratory homogenizer at 8,000 PSI (581 kg/cm²). The resulting formulation was coated onto the oleophilic surface of the cover sheet to a thickness of 0.00125 cm. It was then oven dried for two minutes at about 65° C. and the base sheet was then laminated thereover. The resulting sheet was then image-wise exposed, the base and cover sheets separated and the unexposed areas post exposed and used in a burnishing process as described in examples 3–11. The positive images were burnishable even though they had been completely polymerized by the post exposure. The transferred images were non-tacky and resistant to abrasion and smearing.

EXAMPLE 13

Example 1 was repeated except that the photopolymerizable layer was applied to the oleophilic surface of the cover sheet from the following composition:

| Ingredient | Parts |
|---|---|
| ERL-4221 | 78 |
| Raven 22 | 22 |
| TASHFA (10% by weight in MEK) | 39 |
| EDMA (10% by weight in MEK) | 39 |
| Cab-O-Sil M-5 | 6 |
| Solid polystyrene resin (Dow-685 from Dow Chem. 12½% by weight in MEK) | 50 |
| MEK | 173 |

The dry transfer sheet was imaged as described in Example 1 and the base sheet and the cover sheet stripped away from each other. The cover sheet (with positive image) was then exposed to ultraviolet light for a brief time as described in Example 1 and then images were then burnished onto bond paper. The surface of the image was non-tacky and resistant to smearing and abrasion.

EXAMPLE 14

Example 1 was repeated except that the photopolymerizable layer was applied to the oleophilic surface of the cover sheet from the following composition:

| Ingredient | Parts |
|---|---|
| ERL-4221 | 78 |
| Raven 22 | 22 |
| TASHFA (10% by weight in MEK) | 39 |
| EDMA (10% by weight in MEK) | 39 |
| Cab-O-Sil M-5 | 6 |
| Dow 685 (12.5% by weight in MEK) | 20 |
| MEK | 173 |

The dry transfer sheet was imaged as described in Example 1 and the base sheet and the cover sheet stripped away from each other. The cover sheet (with positive image) was then exposed to ultraviolet light for a brief time as described in Example 1 and the images were then burnished onto bond paper. The surface of the image was non-tacky and resistant to smearing and abrasion.

EXAMPLE 15

Example 1 was repeated except that the photopolymerizable layer was applied to the oleophilic surface of the sheet from the following composition:

| Ingredients | Parts |
|---|---|
| ERL-4221 | 78 |
| Raven 22 | 22 |
| TASHFA (10% by weight in MEK) | 39 |
| EDMA (10% by weight in MEK) | 39 |
| Cab-O-Sil M-5 | 6 |
| Acrylic resin (Elvacite 2044 from E. I. DuPont deNemours and Company, 25% by weight in MEK) | 20 |
| MEK | 173 |

The dry transfer sheet was imaged as described in Example 1 and the base sheet and the cover sheet stripped away from each other. The cover sheet (with positive image) was then exposed to ultraviolet light for a brief time as described in Example 1 and the image were then burnished onto bond paper. The surface of the image was non-tacky and resistant to smearing and abrasion.

EXAMPLE 16

Example 1 was repeated except that the photopolymerizable layer was applied to the oleophilic cover sheet from the following composition:

| Ingredients | Parts |
|---|---|
| ERL-4221 | 78 |
| Raven 22 | 22 |
| TASHFA (10% by weight in MEK) | 39 |
| EDMA (10% by weight in MEK) | 39 |
| Cab-O-Sil M-5 | 6 |
| Kraton 1101 (25% by weight in MEK) | 50 |
| MEK | 173 |

The dry transfer sheet was imaged as described in Example 1 and the base sheet and the cover sheet stripped away from each other. The cover sheet (with positive image) was then exposed to ultraviolet light for a brief time as described in Example 1 and the images were then burnished onto bond paper. The surface of the image was non-tacky and resistant to smearing and abrasion.

EXAMPLES 17–18

Imageable composite dry-transfer sheets were prepared as described in Example 1 using the following compositions as the photopolymerizable layer.

| Ingredients | Parts | |
| --- | --- | --- |
| | 17 | 18 |
| "Epon" 836 (softening point of 40–45° C. available from Shell Chemical Company) | 45.4 | — |
| "Epon" 1001 (softening point of 65–75° C. available from Shell Chemical Company) | — | 45.6 |
| TASHFA | 2.3 | 2.3 |
| DEA | 2.3 | 2.3 |
| MEK | 50 | 50 |
| Modulus of Photopolymerizable Layer (dynes/cm$^2$) | $8 \times 10^5$ | $1 \times 10^{10}$ |

The dry transfer sheets were imaged as described in Example 1 and the base and cover sheets stripped away from each other. In Example 17, the positive image released from the base sheet and adhered to the cover sheet while the negative image did the opposite, thereby exhibiting the desired adhesion/cohesion relationships among the base sheet, the cover sheet and the photopolymerizable layer. In Example 18, neither the positive nor the negative image released from the base sheet but rather both adhered to the cover sheet.

What is claimed is:

1. An imageable composite dry-transfer sheet that comprises (a) a cover sheet that is transmissive to activating radiation and has at least one oleophilic surface, (b) a photopolymerizable layer on the oleophilic surface of said cover sheet that comprises a cationically polymerizable organic material, and from about 0.1 to 10 parts by weight per 100 parts by weight of said organic material of a cationic photopolymerization initiator, and (c) a base sheet that has an oleophobic surface in contact with said photopolymerizable layer;

wherein said photopolymerizable layer has a complex shear modulus of, at most, $1 \times 10^6$ dyne/cm$^2$; and wherein, after image-wise exposure to activating radiation, the interfacial adhesion of the unexposed areas of said photopolymerizable layer is greater for said cover sheet than for said base sheet; the interfacial adhesion of the exposed areas of said photopolymerizable layer is greater for said base sheet than for said cover sheet; and wherein, after separation of said cover and said base sheets, the unexposed areas of said layer are rendered burnishable by subsequent exposure to activating radiation through said cover sheet.

2. An imageable sheet according to claim 1 wherein said photopolymerizable layer further comprises from about 1 to 100 parts by weight per 100 parts by weight of said organic material of a thermoplastic hydrocarbon resin that has a ring and ball softening point of more than about 100° C. and thermoplastic hydrocarbon resin being chemically inert to said organic resin and said initiator.

3. An imageable sheet according to claim 1 wherein said cationically polymerizable organic material is selected from epoxides that have an epoxide functionality of at least one, and materials that have at least one vinyl ether group.

4. An imageable sheet according to claim 3 wherein said cationically polymerizable organic material is an epoxide having an epoxide functionality of at least one.

5. An imageable sheet according to claim 4 wherein said initiator is an aromatic onium salt that has a formula selected from

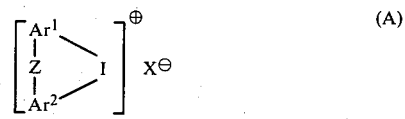

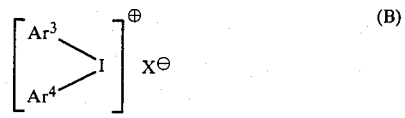

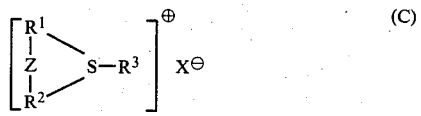

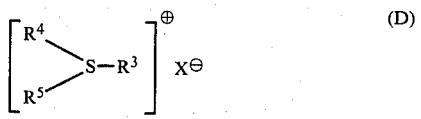

wherein
Ar$^1$ and Ar$^2$ are the same or different substituted and unsubstituted divalent aromatic groups that contain from about 6 to 20 carbon atoms;

Ar$^3$ and Ar$^4$ are the same or different substituted or unsubstituted monovalent aromatic groups that contain from about 7 to 20 carbon atoms;

R$^1$ and R$^2$ are selected from substituted and unsubstituted divalent aromatic groups that contain from about 6 to 20 carbon atoms and substituted and unsubstituted alkylene groups that contain from 1 to about 20 carbon atoms;

R$^3$, R$^4$, and R$^5$ are each selected from substituted and unsubstituted monovalent aromatic groups that contain from about 6 to 20 carbon atoms and substituted and unsubstituted alkyl groups that contain from 1 to about 20 carbon atoms; provided that at least one of R$^1$, R$^2$, and R$^3$ is aromatic in formula C and at least one of R$^3$, R$^4$, and R$^5$ is aromatic in formula D;

Z is selected from the group consisting of a carbon-to-carbon bond, oxygen, sulfur,

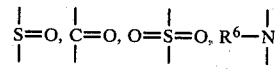

wherein R$^6$ is aryl or acyl,

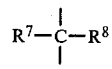

wherein R and R are selected from hydrogen, alkyl groups that contain from about 1 to 4 carbon atoms, and alkenyl groups that contain from about 2 to 4 carbon atoms; and X is a halogen-containing complex anion.

6. An imageable sheet according to claim 5 wherein X$^{\ominus}$ is selected from tetrafluoroborate, hexafluoroantimonate, hexafluoroarsenate and hexafluorophosphate.

7. An imageable sheet according to claim 6 wherein said photoinitiator is an aromatic iodonium salt.

8. An imageable sheet according to claim 7 wherein said initiator is selected from diphenyliodonium hexafluorophosphate and bis-(2,4-dimethylphenyl)iodonium hexafluoroantimonate.

9. An imageable sheet according to claim 6 wherein said photoinitiator is an aromatic sulfonium salt.

10. An imageable sheet according to claim 8 wherein said initiator is selected from triarylsulfonium hexafluoroantimonate and triarylsulfonium hexafluoroarsenate.

11. An imageable sheet according to claim 3 wherein said organic material contains at least one vinyl ether group.

12. An imageable sheet according to claim 11 wherein said initiator is selected from
 (a) halogen-containing organic compounds which contain halogen attached to carbon and which, upon exposure to radiation of suitable wavelength, is dissociable with formation of halogen-free radicals, the bond dissociation energy for the carbon-to-halogen bond being in the range of about 40 to 70 kilogram calories per mole; and
 (b) an aromatic onium salt that has a formula selected from

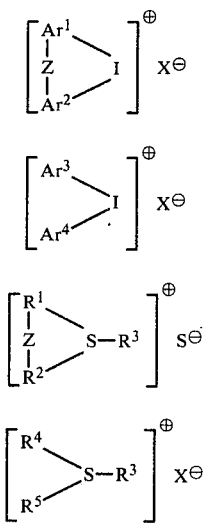

wherein
Ar$^1$ and Ar$^2$ are the same or different substituted and unsubstituted divalent aromatic groups that contain from about 6 to 20 carbon atoms;
Ar$^3$ and Ar$^4$ are the same or different substituted orunsubstituted monovalent aromatic groups that contain from about 6 to 20 carbon atoms;
R$^1$ and R$^2$ are selected from substituted and unsubstituted divalent aromatic groups that contain from about 6 to 20 carbon atoms and substituted or unsubstituted alkylene groups that contain from 1 to about 20 carbon atoms;
R$^3$, r$^4$, and R$^5$ are each selected from substituted and unsubstituted monovalent aromatic groups that contain from about 6 to 20 carbon atoms and substituted and unsubstituted alkyl groups that contain from 1 to about 20 carbon atoms; provided that at least one of R$^1$, R$^2$, and R$^3$ is aromatic in formula C and at least one of R$^3$, R$^4$, and R$^5$ is aromatic in formula D;
Z is selected from a carbon-to-carbon bond, oxygen, sulfur,

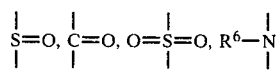

wherein R$^6$ is aryl or acyl,

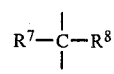

wherein R$^7$ and R$^8$ are selected from hydrogen, alkyl groups that contain from about 1 to 5 carbon atoms, and alkenyl groups that contain from about 2 to 4 carbon atoms; and
X is a halogen-containing complex anion.

13. An imageable sheet according to claim 12 wherein said initiator is said halogen-containing organic compound.

14. An imageable sheet according to claim 13 wherein said halogen-containing organic compound is selected from 1,3,5-tristrichloromethyltriazine, 1,3,5-tristribromomethyltriazine, hexabromomethane, carbon tetrabromide,α,α'-dibromo-o-xylene and 1-methyl-3,5-bistribromomethyl triazine.

15. An imageable sheet according to claim 12 wherein said photoinitiator is an aromatic onium salt.

16. An imageable sheet according to claim 15 wherein X$^{\ominus}$ is selected from tetrafluoroborate, hexafluoroantimonate, hexafluoroarsenate, and hexafluorophosphate.

17. An imageable sheet according to claim 16 wherein said photoinitiator is an aromatic iodonium salt.

18. An imageable sheet according to claim 17 wherein said photoinitiator is selected from diphenyliodonium hexafluorophosphate and bis-(2,4-dimethylphenyl)iodonium hexafluoroantimonate.

19. An imageable sheet according to claim 16 wherein said photoinitiator is an aromatic sulfonium salt.

20. An imageable sheet according to claim 19 wherein said initiator is selected from triarylsulfonium hexafluoroantimonate and triarylsulfonium hexafluoroarsenate.

21. An imageable sheet according to claim 1 further comprising up to about 10 parts by weight of a sensitizing dye per 100 parts by weight of said organic material.

22. An imageable sheet according to claim 2 wherein said thermoplastic resin is selected from block copolymers, acrylic resins, and polyolefin resins.

23. An imageable sheet according to claim 22 wherein said thermoplastic resin is a block copolymer that has terminal groups of styrene and central blocks selected from butadiene groups and combinations of ethylene and butylene groups.

24. An imageable sheet according to claim 23 wherein said central blocks are butadiene groups.

25. An imageable sheet according to claim 23 wherein said central blocks are combinations of ethylene and butylene groups.

26. An imageable sheet according to claim 1 wherein said photopolymerizable layer further includes at least one material selected from plasticizing agents, tackifiers, extenders, colorants, fillers, and viscosity modifiers.

27. An imageable sheet according to claim 2 wherein said thermoplastic hydrocarbon resin comprises from about 10 to 40 parts by weight per 100 parts by weight of said cationically polymerizable organic material.

28. An imageable sheet according to claim 27 wherein said thermoplastic hydrocarbon resin comprises about 20 parts by weight of said cationically polymerizable organic material.

29. A process for image production and transfer that comprises the steps of
image-wise exposing the dry-transfer sheet of claim 1 to activating radiation through the cover sheet to provide photopolymerized areas in said dry transfer sheet;
separating the base sheet and cover sheet of the exposed dry-transfer sheet, wherein the photopolymerized areas of the photopolymerizable layer adhere to said base sheet and the non-photopolymerized areas of the photopolymerizable layer adhere to said cover sheet;
irradiating the non-photopolymerized areas through said cover sheet with activating radiation for a time sufficient to at least partially photopolymerize said non-photopolymerized areas; and
transferring the at least partially photopolymerized areas from said base sheet to a receptor by burnishing.

30. A process according to claim 29 wherein the non-photopolymerized areas comprise positive image areas.

31. A process according to claim 29 wherein the non-photopolymerized areas are completely photopolymerized by exposure to actinic radiation after said base sheet and said cover sheet are separated from one another but before burnishing.

* * * * *

UNITED STATES PATENT AND TRADEMARK OFFICE
CERTIFICATE OF CORRECTION

PATENT NO. : 4,291,114

DATED : September 22, 1981

INVENTOR(S) : William R. Berggren & Shelby J. Brownley

It is certified that error appears in the above—identified patent and that said Letters Patent is hereby corrected as shown below:

Col. 19, line 54, "then" should read --the--.

Col. 22, line 64, Claim 5, "R and R" should read --$R^7$ and $R^8$--.

Col. 23, line 57, Claim 12, "orunsubstituted" should read --or unsubstituted--.

Col. 23, line 64, Claim 12, "$r^4$" should read --$R^4$--.

Signed and Sealed this

Twenty-ninth Day of December 1981

[SEAL]

Attest:

GERALD J. MOSSINGHOFF

Attesting Officer — Commissioner of Patents and Trademarks